(12) United States Patent
Hung et al.

(10) Patent No.: US 8,936,966 B2
(45) Date of Patent: Jan. 20, 2015

(54) PACKAGING METHODS FOR SEMICONDUCTOR DEVICES

(75) Inventors: Jui-Pin Hung, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 414 days.

(21) Appl. No.: 13/369,083

(22) Filed: Feb. 8, 2012

(65) Prior Publication Data

US 2013/0203215 A1    Aug. 8, 2013

(51) Int. Cl.
*H01L 21/00*    (2006.01)

(52) U.S. Cl.
USPC .... 438/106; 438/107; 438/110; 257/E21.499; 257/E21.505; 257/E21.513

(58) Field of Classification Search
None
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,250,843 A | 10/1993 | Eichelberger | |
| 5,380,681 A | 1/1995 | Hsu | |
| 5,481,133 A | 1/1996 | Hsu | |
| 5,844,315 A | 12/1998 | Melton et al. | |
| 6,002,177 A | 12/1999 | Gaynes et al. | |
| 6,087,202 A | 7/2000 | Exposito et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,538,317 B1 | 3/2003 | Miyata | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |

(Continued)

OTHER PUBLICATIONS

"Polymer," Wikipedia, the free encyclopedia, online, downloaded Jun. 22, 2011, 16 pgs., http://en.wikipedia.org/wiki/Polymer.

(Continued)

*Primary Examiner* — Mohsen Ahmadi
(74) *Attorney, Agent, or Firm* — Slater & Matsil, L.L.P.

(57) ABSTRACT

Methods of packaging semiconductor devices are disclosed. In one embodiment, a packaging method for semiconductor devices includes providing a workpiece including a plurality of first dies, and coupling a plurality of second dies to the plurality of first dies. The plurality of second dies and the plurality of first dies are partially packaged and separated. Top surfaces of the second dies are coupled to a carrier, and the partially packaged plurality of second dies and plurality of first dies are fully packaged. The carrier is removed, and the fully packaged plurality of second dies and plurality of first dies are separated.

20 Claims, 10 Drawing Sheets

(56) References Cited

U.S. PATENT DOCUMENTS

| | | |
|---|---|---|
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,138,711 B2 | 11/2006 | Yee et al. |
| 7,144,800 B2 | 12/2006 | Mostafazadeh et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,388,293 B2 | 6/2008 | Fukase et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,750,459 B2 | 7/2010 | Dang et al. |
| 7,776,649 B1 | 8/2010 | Fan |
| 7,834,450 B2 | 11/2010 | Kang |
| 7,893,542 B2 | 2/2011 | Tachibana et al. |
| 8,048,781 B2 | 11/2011 | How |
| 8,105,875 B1 | 1/2012 | Hu et al. |
| 8,183,677 B2 * | 5/2012 | Meyer-Berg ............. 257/686 |
| 8,188,593 B2 | 5/2012 | Chen et al. |
| 8,309,454 B2 | 11/2012 | Brunnbauer et al. |
| 8,319,349 B2 | 11/2012 | Hu et al. |
| 2003/0230813 A1 | 12/2003 | Hirano et al. |
| 2004/0161876 A1 | 8/2004 | Tandy et al. |
| 2004/0207094 A1 | 10/2004 | Sugizaki et al. |
| 2008/0136009 A1 | 6/2008 | Theuss et al. |
| 2010/0013081 A1 | 1/2010 | Toh et al. |
| 2010/0044853 A1 | 2/2010 | Dekker et al. |
| 2010/0140805 A1 | 6/2010 | Chang et al. |
| 2010/0193923 A1 | 8/2010 | Tanaka et al. |
| 2010/0200992 A1 | 8/2010 | Purushothaman et al. |
| 2010/0216281 A1 | 8/2010 | Pagaila et al. |
| 2010/0248452 A1 | 9/2010 | Saito et al. |
| 2010/0327439 A1 | 12/2010 | Hwang et al. |
| 2011/0062592 A1 * | 3/2011 | Lee et al. .................. 257/774 |
| 2011/0111563 A1 | 5/2011 | Yanagi et al. |
| 2011/0217814 A1 | 9/2011 | Gao et al. |
| 2011/0241222 A1 | 10/2011 | Sezi et al. |
| 2011/0254157 A1 | 10/2011 | Huang et al. |
| 2011/0266701 A1 | 11/2011 | Wan et al. |
| 2011/0291288 A1 | 12/2011 | Wu et al. |
| 2012/0018897 A1 | 1/2012 | Park et al. |
| 2012/0038044 A1 | 2/2012 | Chang et al. |
| 2012/0104578 A1 | 5/2012 | Hu et al. |
| 2012/0139120 A1 | 6/2012 | Chow et al. |
| 2012/0235309 A1 | 9/2012 | Essig et al. |
| 2012/0270381 A1 | 10/2012 | Joo et al. |
| 2012/0309130 A1 | 12/2012 | Hin et al. |
| 2013/0049205 A1 | 2/2013 | Meyer et al. |
| 2013/0062760 A1 | 3/2013 | Hung et al. |

OTHER PUBLICATIONS

"Thermoplastic," Wikipedia, the free encyclopedia, online, downloaded Jun. 22, 2011, 1 pg., http://en.wikipedia.org/wiki/Thermoplastic.

* cited by examiner

PACKAGING METHODS FOR SEMICONDUCTOR DEVICES

CROSS-REFERENCE TO RELATED APPLICATIONS

This application relates to the following co-pending and commonly assigned patent applications: Ser. No. 13/228,244, filed on Sep. 8, 2011 entitled, "Packaging Methods and Structures Using a Die Attach Film;" Ser. No. 12/904,835, filed on Oct. 14, 2010, entitled, "Approach for Bonding Dies onto Interposers;" and Ser. No. 13/228,768, filed on Sep. 9, 2011 entitled, "Packaging Methods and Structures for Semiconductor Devices," which applications are hereby incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

What are needed in the art are improved packaging structures and methods for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the packaging of semiconductor devices. Novel methods of packaging dies will be described herein.

Figure 1:
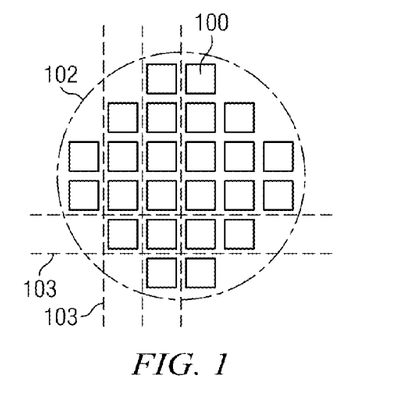
FIG. 1 is a top view and FIGS. 2 through 12 illustrate cross-sectional views of a method of packaging dies in accordance with an embodiment of the present disclosure.

FIG. 1 is a top view and FIGS. 2 through 12 illustrate cross-sectional views of a method of packaging dies in accordance with an embodiment of the present disclosure. Referring first to FIG. 1, there is shown a top view of a workpiece 102 including a plurality of dies 100 formed thereon. The workpiece 102 is also referred to herein as a first workpiece 102. The workpiece 102 may include a semiconductor substrate comprising silicon or other semiconductor materials and may be covered by an insulating layer, for example. The workpiece 102 may also include active components or circuits, not shown. The workpiece 102 may comprise silicon oxide over single-crystal silicon, for example. The workpiece 102 may include conductive layers or semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 has a plurality of dies 100 formed across the surface thereof. The dies 100 are referred to herein as second dies 100, top dies 100, or a plurality of second dies 100. The dies 100 may comprise substantially the same size, shape, and may have substantially the same function in some embodiments. Alternatively, the dies 100 may have different sizes, shapes, and functions, in other embodiments. The dies 100 may comprise logic, memory, or other types of devices, as examples. Alternatively, the dies 100 may comprise other types of functions and circuitry. The dies 100 may comprise integrated circuits having more than one function in some embodiments, for example. The dies 100 are singulated along singulation lines 103 after they are fabricated and ready for packaging.

A plurality of the workpieces 102 may be provided, and different types and/or sizes (or the same type and size) of dies 100 may be formed on each of the plurality of workpieces 102 in some embodiments, for example.

Figure 2:
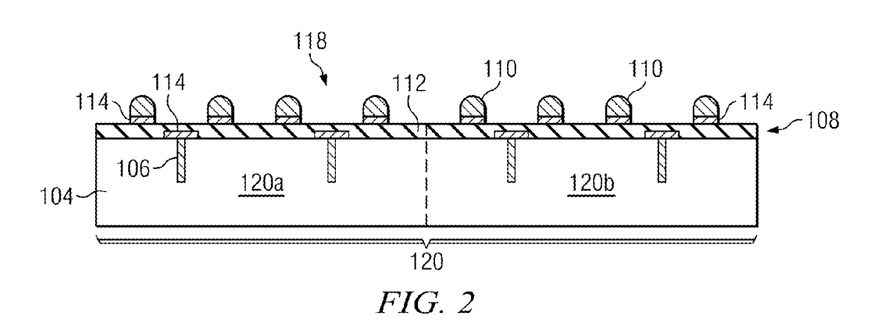

A workpiece 118 is also provided, as shown in FIG. 2. The workpiece 118 is also referred to herein as a second workpiece 118. The second workpiece 118 may comprise similar materials and devices formed thereon as described for the first workpiece 102, in some embodiments. Alternatively, the second workpiece 118 may comprise an interposer material that either includes or does not include active semiconductor devices formed thereon.

Figure 6:
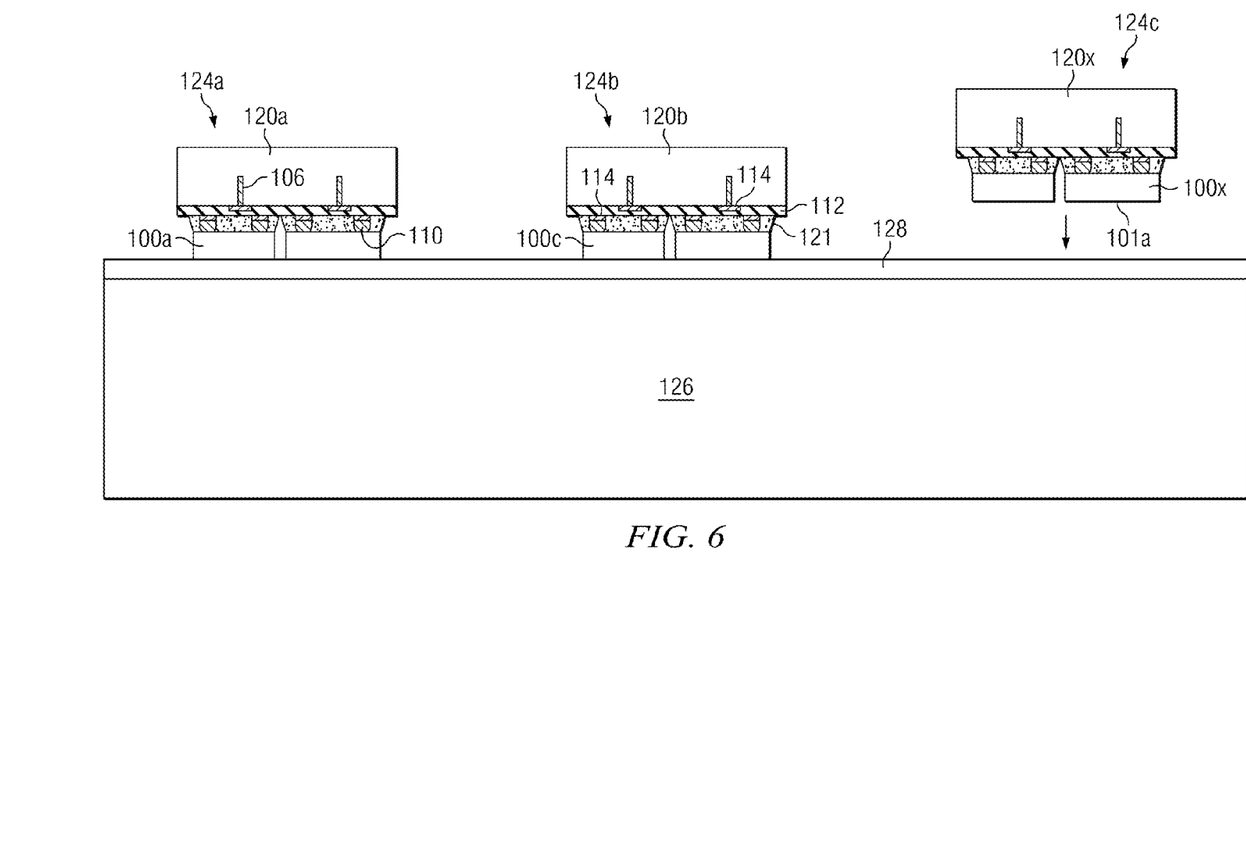

A plurality of dies 120 are formed on the workpiece 118, e.g., dies 120a and 120b shown in FIG. 2. Only two dies 120a and 120b are shown in FIG. 2; alternatively, dozens or hundreds of dies may be formed across a surface of the workpiece 118. For example, an additional die 120x is shown in FIGS. 6 though 11. The dies 120a and 120b are also referred to herein as first dies 120a and 120b or bottom dies 120a and 120b. The first dies 120a and 120b may comprise interposers that include the workpiece 118 having a substrate 104 with conductive features comprising a plurality of through-substrate vias (TSVs) 106 formed therein, in some embodiments. The TSVs 106 may comprise copper, other materials, or multiple layers or combinations thereof, as examples.

In the embodiments described herein, the term "die" should be interpreted broadly and expansively to cover substrates, workpieces, integrated circuit dies (that are either functioning or non-functioning when a packaged device is used in the operation of a completed device), interposers, and other similar integrated circuit devices and packaging devices, as examples.

A wiring layer 108 which may comprise a redistribution layer (RDL) 108 may be disposed proximate a top surface of the first dies 120a and 120b. The wiring layer 108 includes an insulating material 112 and conductive material 114 comprising conductive lines and vias disposed in the insulating material 112. The conductive material 114 may include a plurality of bond pads coupled to the plurality of TSVs 106, and the plurality of first dies 120a and 120b may include a plurality of metal bumps 110 formed over portions of the conductive material 114, e.g., on the bond pads. The metal bumps 110 may comprise solder and may comprise microbumps in some embodiments, for example, although alternatively, the bumps 110 may comprise other materials.

Figure 3:
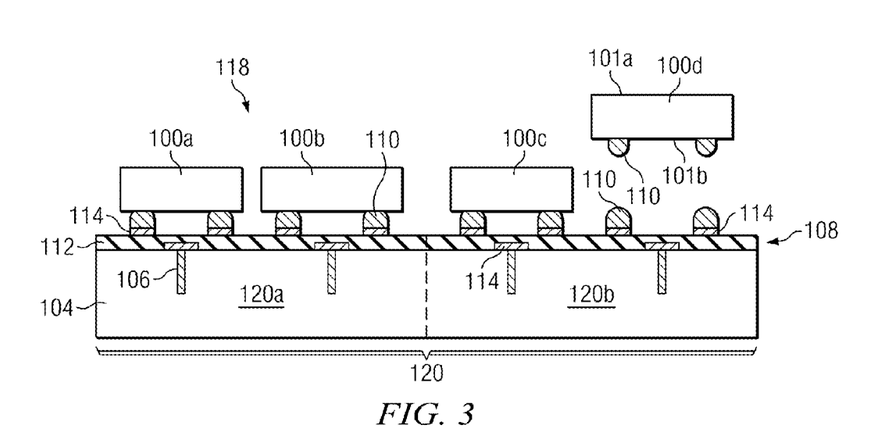

In accordance with embodiments of the present disclosure, a workpiece 118 including the plurality of first dies 120a and 120b is provided, and a plurality of second dies 100a, 100b, 100c, and 100d which may comprise dies 100 shown in FIG. 1 formed on one or more workpieces 102 is coupled to the plurality of first dies 120a and 120b, as shown in FIG. 3. In some embodiments, the plurality of second dies 100a, 100b, 100c, and 100d comprise dies that are manufactured on different source wafers or workpieces 102. For example, dies 100b and 100d may be manufactured on a different workpiece 102 than dies 100a and 100c are manufactured on. As one example, dies 100a and 100c may be manufactured on a workpiece 102 comprising a 12" logic wafer, and dies 100b and 100d may be manufactured on a workpiece 102 comprising an 8" dynamic random access memory (DRAM) wafer. Alternatively, dies 100a, 100b, 100c, and 100d may comprise other types of devices, circuitry, or functions and the dies 100a, 100b, 100c, and 100d may also comprise the same types of dies, for example.

The second dies 100a, 100b, 100c, and 100d have a top surface 101a and a bottom surface 101b. The bottom surface 101b of the second dies 100a, 100b, 100c, and 100d is coupled to the first dies 120a and 120b. The second dies 100a, 100b, 100c, and 100d may be attached to the first dies 120a and 120b using a pick-and-place machine in some embodiments, for example. Conductive bumps 110 may optionally also be formed on the bottom surface 101b of the second dies 100a, 100b, 100c, and 100d, as shown. The workpiece 118 is exposed to a solder reflow process to connect the second dies 100a, 100b, 100c, and 100d to the first dies 120a and 120b.

In some embodiments, two or more second dies 100a, 100b, 100c, and 100d are attached to each of the first dies 120a and 120b, as shown in FIG. 3. Alternatively, a single second die 110a may be attached to a single first die 120a, for example, not shown in the drawings. Three or more second dies 100a, 100b, 100c, and 100d may be attached to each of the first dies 120a and/or 120b in other embodiments.

Figure 4:
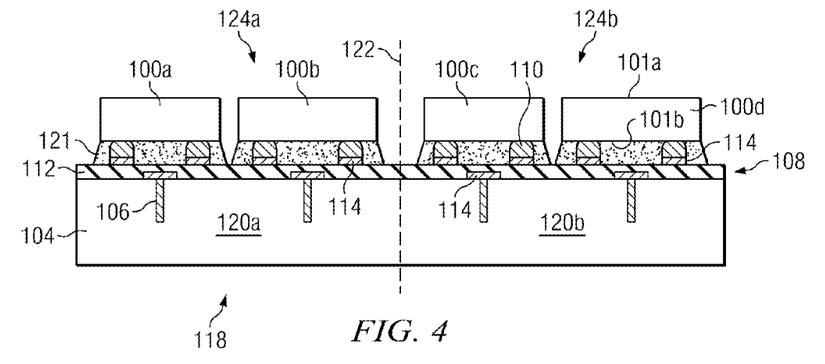

The plurality of second dies 100a, 100b, 100c, and 100d and the plurality of first dies 120a and 120b are next partially packaged, in accordance with embodiments. The partial packaging may be performed by disposing an underfill material 121 under each second die 100a, 100b, 100c, and 100d between the bottom surface 101b of the second dies 100a, 100b, 100c, and 100d and the first dies 120a and 120b, as shown in FIG. 4. The underfill material 121 may applied using a dispensing needle. The underfill material 121 may comprise an epoxy or polymer comprising a liquid when applied that flows beneath the top dies 100a, 100b, 100c, and 100d between the microbumps 110. The underfill material 121 is then cured using heat to form a solid. Alternatively, the underfill material 121 may comprise other materials and may be applied and cured using other methods.

The workpiece 118 comprising the plurality of first dies 120a and 120b is then singulated. The partially packaged plurality of first dies 120a and 120b, and also the plurality of second dies 100a, 100b, 100c, and 100d which reside on top of the plurality of first dies 120a and 120b are singulated at singulation lines 122, as shown in FIG. 4. The partially packaged devices 124a and 124b are also referred to herein as partially packaged dies or a partially packaged plurality of first dies and plurality of second dies.

The partially packaged devices 124a and 124b are next fully packaged, in accordance with embodiments. The partially packaged devices 124a and 124b are fully packaged by attaching them to a carrier 126 (FIGS. 5 and 6), forming a molding compound 130 over the first dies 120a, 120b, and 120x (FIG. 7), removing a portion of the first dies 120a, 120b, and 120x to expose the TSVs 106 (FIG. 8), forming a wiring structure 132 over the TSVs 106 (FIG. 9), forming conductive balls 138 over the wiring structure 132 (FIG. 10), and singulating the packaged devices 150 (FIGS. 11 and 12), to be described further herein.

Figure 5:
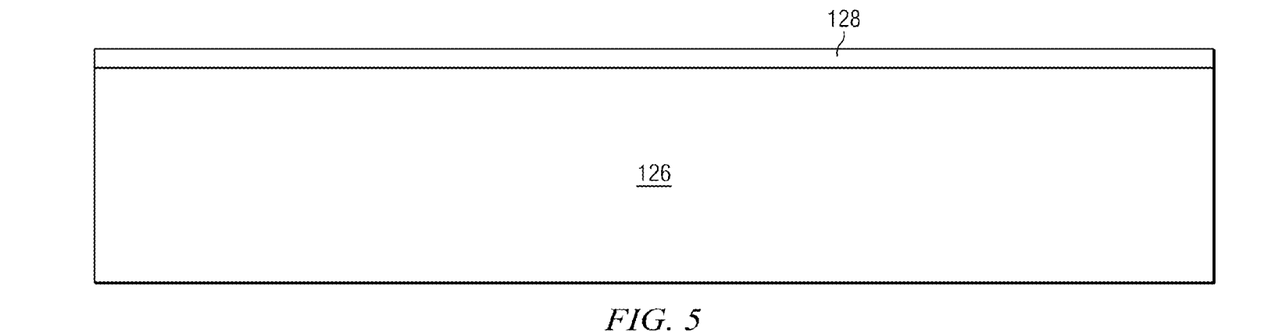

Referring next to FIG. 5, a carrier 126 is provided, as shown in FIG. 5. The carrier 126 may comprise a wafer comprising glass, silicon (e.g., a silicon wafer), silicon oxide, metal plate, or a ceramic material, as examples. An adhesive 128 is applied over the carrier wafer 100. The adhesive 128 may comprise foil, epoxy, silicone rubber, a polymer, and/or a metal, as examples, although other materials may also be used. The adhesive 128 may be applied by spin-coating, printing, chemical vapor deposition (CVD), or physical vapor deposition (PVD), as examples. If the adhesive 128 comprises a foil, the foil may be laminated onto the carrier 126, for example.

The partially packaged devices 124a, 124b, and 124c are attached to the carrier 126, e.g., to the adhesive 128 on the carrier 126, as shown in FIG. 6. Only three partially packaged devices 124a, 124b, and 124c are shown in FIGS. 6 through 11; however, dozens or hundreds of partially packaged devices may be attached to the carrier 126. After singulation of the partially packaged devices 124a, 124b, and 124c, the partially packaged devices 124a, 124b, and 124c are inverted, and the top surfaces 101a of the second dies 100a, 100b, 100c, 100d, . . . 100x are attached to the carrier 126 using a pick-and-place machine, manually, or other methods.

Figure 7:
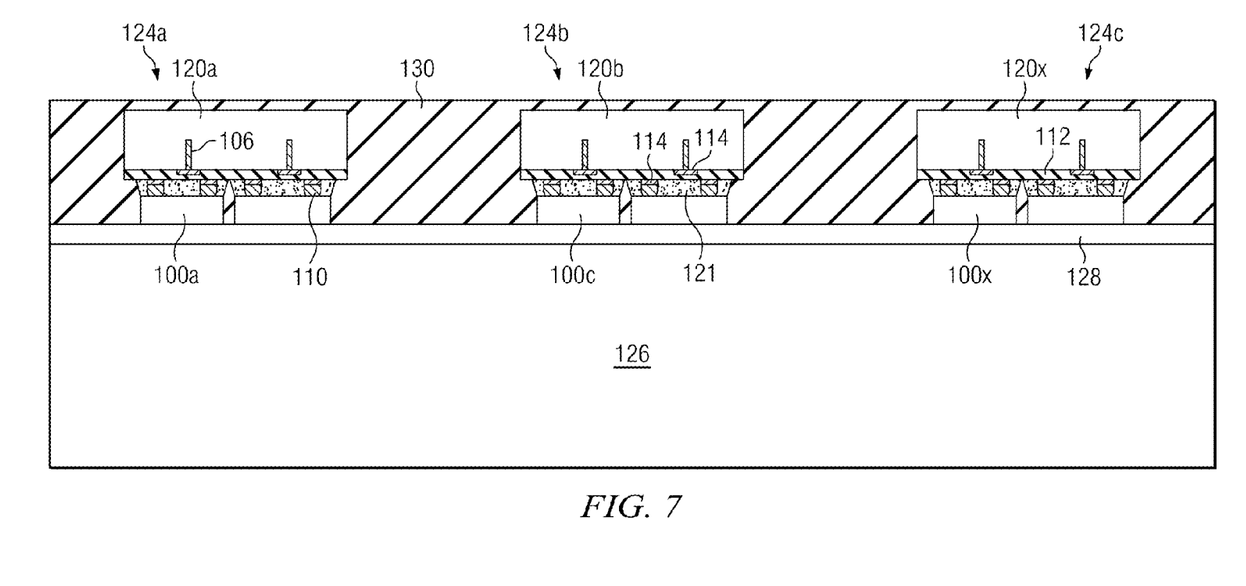

A molding compound 130 is formed over the first dies 120a, 120b, and 120x, as shown in FIG. 7. The molding compound 130 is formed over the first dies 120a, 120b, and 120x, the second dies 100a, 100b, 100c, 100d, . . . 100x, and over the adhesive 128 on the carrier wafer 126. The molding compound 130 may comprise compression molding and may comprise epoxy, rubber, or polyimide (PI) in some embodiments, for example, although the molding compound 130 may alternatively comprise other materials. The molding compound 130 fills the spaces between the partially packaged devices 124a, 124b, and 124c. A portion of the molding compound 130 may be formed over top surfaces of the partially packaged devices 124a, 124b, and 124c.

Figure 8:
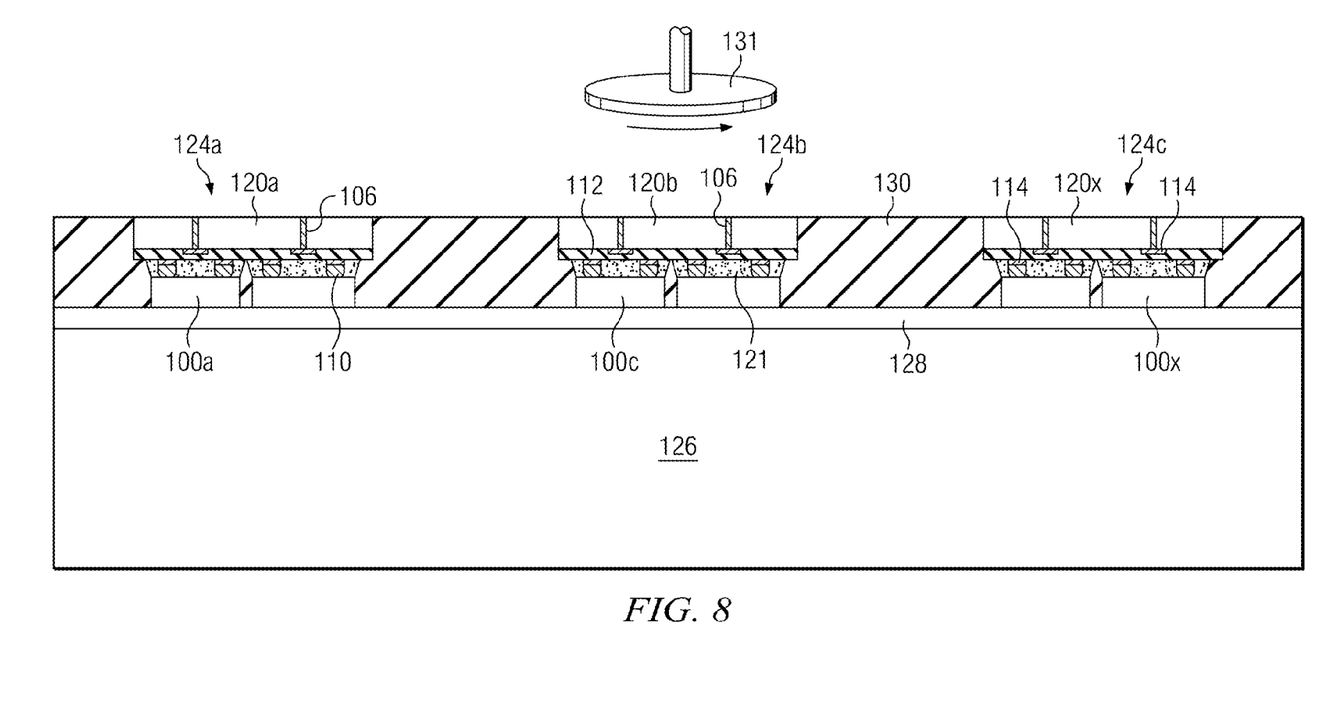

Next, a top portion of the molding compound 130 and a portion of the first dies 120a, 120b, and 120x are removed to expose the TSVs 106 formed within the first dies 120a, 120b, and 120x, as shown in FIG. 8. The device shown in FIG. 7 may be exposed to one or more grinding processes, etch processes, polishing processes, and/or chemical-mechanical polishing (CMP) processes 131 to remove a top portion of the molding compound 130 and also remove a portion of the first dies 120a, 120b, and 120x, exposing top surfaces of the TSVs 106, as shown in FIG. 8. The grinding process 131 or other removal process may be adapted to stop on the material of the TSVs 106 in some embodiments, for example. Alternatively, a portion of the TSVs 106 may be removed, leaving the top surfaces of the TSVs 106 exposed.

Figure 9:
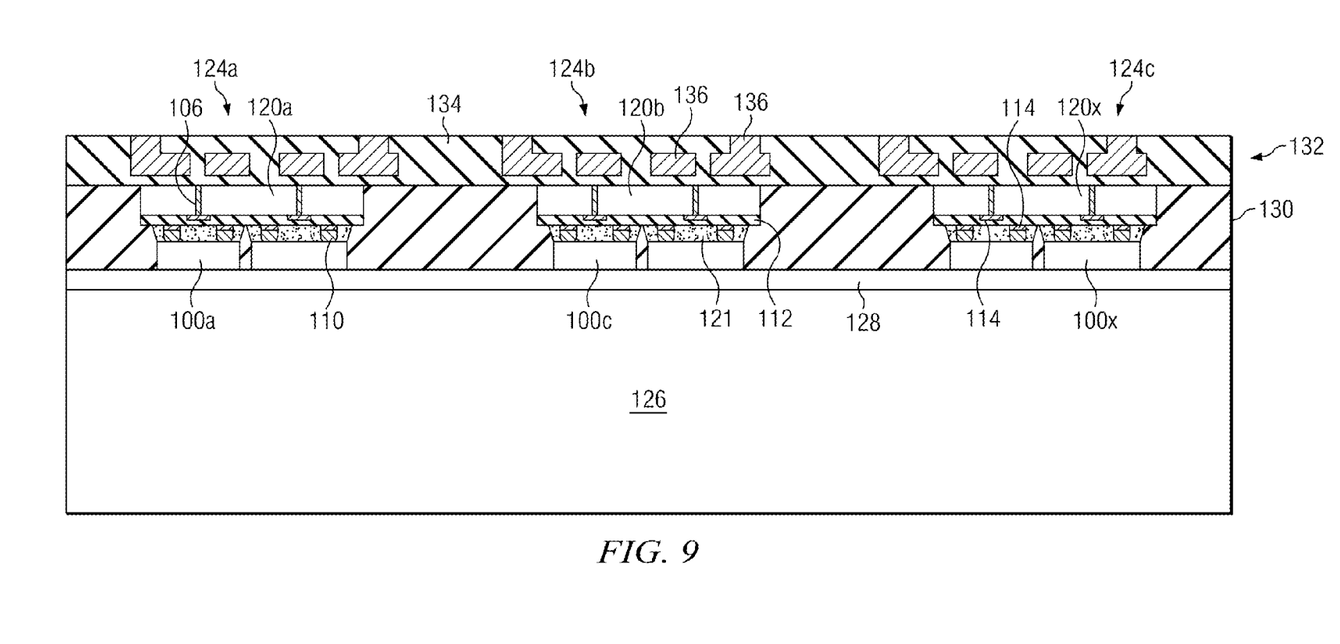

A wiring structure 132 is then formed over the molding compound 130 and the remaining portions of the first dies 120a, 120b, and 120x, as shown in FIG. 9. The wiring structure 132 may comprise a redistribution layer (RDL) that includes one or more insulating layers 134 and wiring 136 layers. The wiring structure 132 may include inter-level dielectrics (ILDs) with wiring 136 in metallization layers disposed or formed therein. The wiring 136 may comprise one or more vias and/or conductive lines, for example. One or more of the vias and/or conductive lines may be coupled together within the ILDs comprising the insulating material 134, as shown. Portions of the wiring 136 are coupled to the TSVs 106 of the first dies 120a, 120b, and 120x. Portions of the wiring 136 comprise ball pads and/or contact pads. Forming the wiring structure 132 effectively comprises reconstructing a wafer, e.g., of the various components disposed over the carrier 126.

The wiring 136 of the wiring structure 132 may be formed by one or more single or dual damascene techniques by patterning the insulating material 134 and filling the patterns with a conductive material. Or, the wiring 136 may be formed by one or more subtractive etch processes, and the insulating material 134 may be formed over the wiring 136 after each subtractive etch process, for example.

Figure 10:
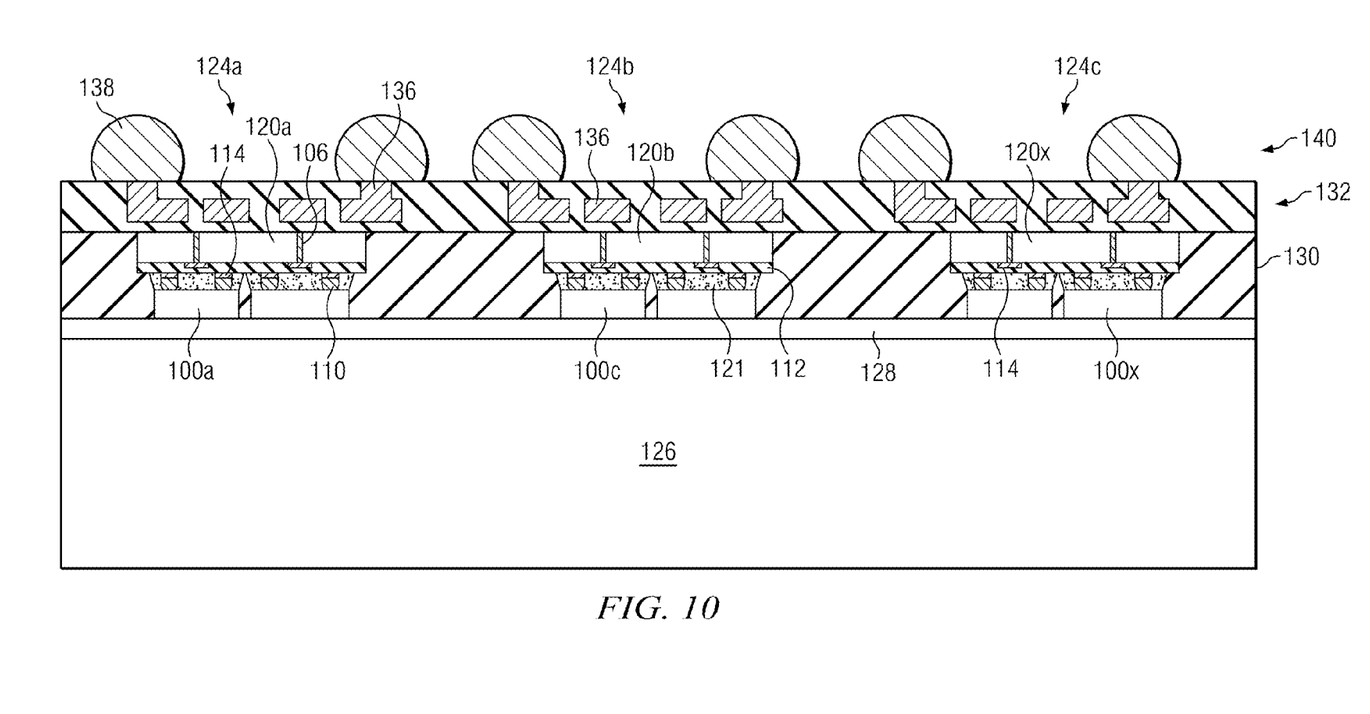

Conductive balls 138 are formed over the wiring structure 132, as shown in FIG. 10. The conductive balls 138 may be electrically coupled to ball pads of the wiring structure 132. The conductive balls 138 may comprise solder and/or other metals and may comprise a plurality of conductive bumps. The conductive balls 138 may comprise controlled collapse chip connection (C4) bumps in some embodiments, for example. The conductive balls 138 are coupled to the wiring 136 of the wiring structure 132. The conductive balls 138 may be directly mounted and subsequently tested, for example.

The conductive balls 138 may comprise solder balls of a ball grid array (BGA) in some embodiments. The wiring structure 132 may comprising wiring 136 that has a fan-out layout, wherein an area of the BGA is larger than an area of one of the plurality of interposers or first dies 120a, 120b, or 120x, for example.

Figure 11:
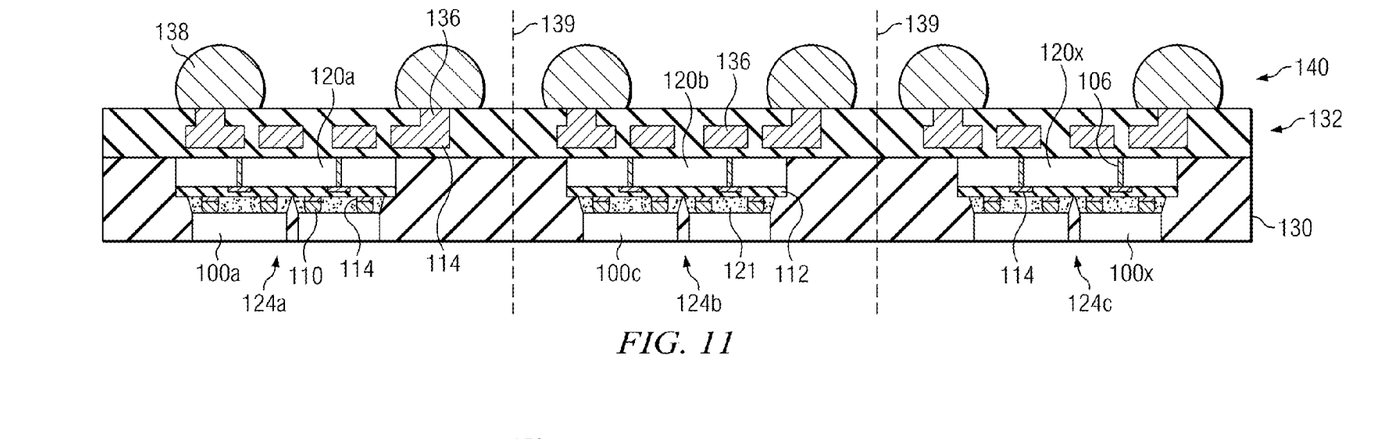

The carrier 126 is then removed or de-bonded from the plurality of second dies 100a, 100b, 100c, 100d, and 100x and the molding compound 130, as shown in FIG. 11.

Figure 12:
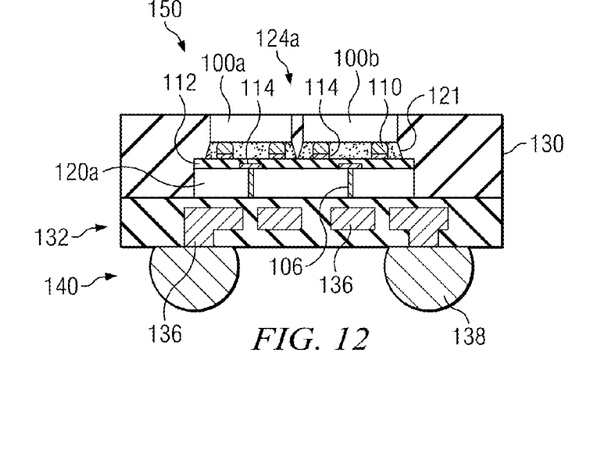

The packaged devices 150 are singulated at singulation lines 139 using a die saw, also shown in FIG. 11, leaving packaged devices 150, as shown in FIG. 12. The packaged devices 150 are also referred to herein as packaged pluralities of dies or packaged semiconductor devices. Only one partially packaged device 124a and one packaged device 150 are shown in FIG. 12; however, a plurality of the packaged devices 150 are formed from the partially packaged devices 124a, 124b, and 124c shown in the previous drawings. Singulating the packaged plurality of dies 150 may comprise separating the plurality of second dies 100a, 100b, 100c, 100d, . . . 100x in groups of two or more over the plurality of first dies or interposers 120a, 120b, and 120x, for example. The packaged device 150 may then be coupled to a printed circuit board (PCB), to another packaged integrated circuit, to an electrical or mechanical module, or other devices using the conductive balls 138 of the packaged devices 150.

The novel packaged semiconductor device 150 shown in FIG. 12 comprises a 3DIC that includes a first die 120a comprising TSVs 106. The packaged semiconductor device 150 comprises a multi-chip package wherein the dies 100a and 120a, and dies 100b and 120a, are positioned vertically in the package. The packaged semiconductor device 150 includes two (or more, not shown) of the plurality of second dies 100a and 100b coupled vertically over one of the plurality of first dies 120a. The two (or more) of the plurality of second dies 100a and 100b are coupled horizontally with respect to one another in the packaged semiconductor device 150. The second dies 100a and 100b may be coupled together by the vertical connections provided by the TSVs 106 of the first die 120a, by the wiring layer 108 of the first die 120a (see FIG. 2), and/or by the wiring structure 132. The packaged semiconductor device 150 advantageously may comprise a system in a package (SiP), for example. In some embodiments, the packaged plurality of dies 150 may comprise a three dimensional integrated circuit (3DIC) fan-out wafer level package (WLP), as another example, in other embodiments.

Figure 13:
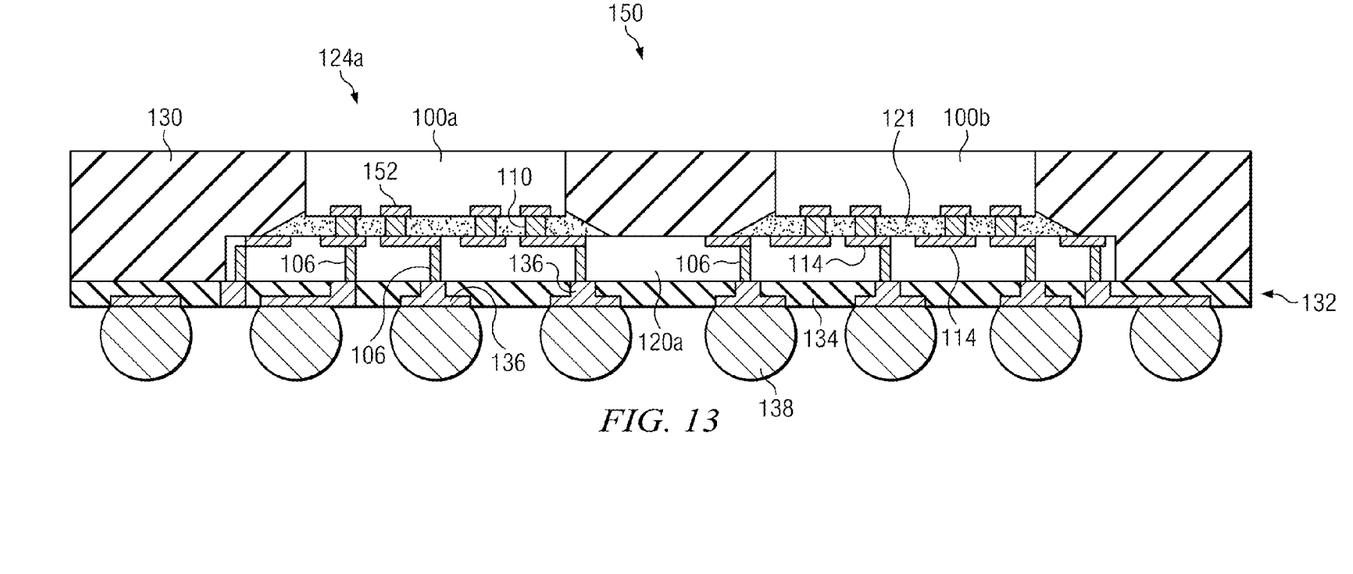
FIG. 13 is a more detailed cross-sectional view of two top dies packaged in a single package horizontally with respect to each other and vertically with respect to a bottom die in accordance with an embodiment.

FIG. 13 is a more detailed cross-sectional view of two second dies 100a and 100b packaged in a single package horizontally with respect to each other, and vertically with respect to first die 120a in accordance with an embodiment. The top dies 100a and 100b may comprise different sizes, or may comprise substantially the same size. The top dies 100a and 100b may comprise the different types of devices or may comprise the same types of devices, for example. Contact pads 152 of the top dies 100a and 100b can be seen that make electrical contact to the bumps 110 (which are shown as rectangular after the reflow process).

Figure 14:
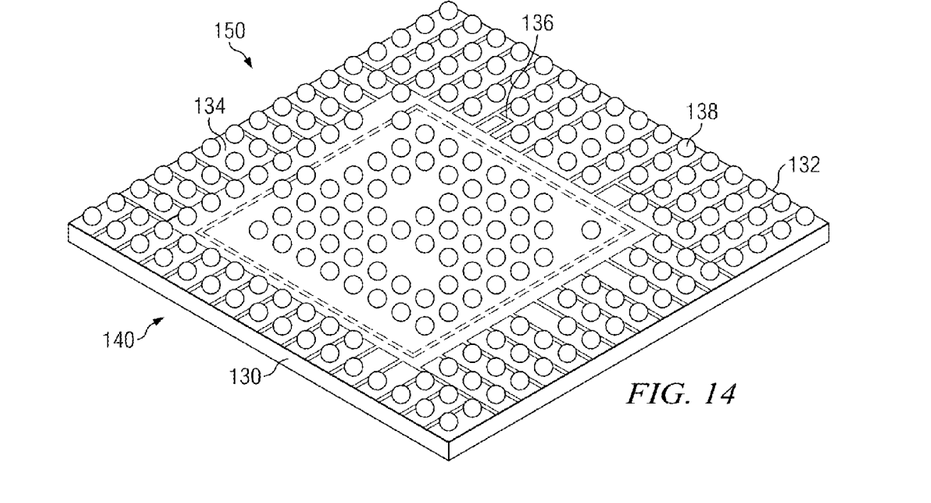
FIG. 14 is a perspective view of a ball grid array (BGA) layout in accordance with an embodiment.

FIG. 14 is a perspective view of a ball grid array (BGA) layout of the packaged semiconductor device 150. The layout of the BGA is shown as an example; alternatively, other arrangements of the solder balls 138 may be used, depending on the application. Portions of the wiring 136 and insulating material 134 of the wiring structure 132 may be viewed from the bottom of the packaged semiconductor device 150, proximate the solder balls 138. The molding compound 130 is disposed proximate an edge of the packaged semiconductor device 150.

Figure 15:
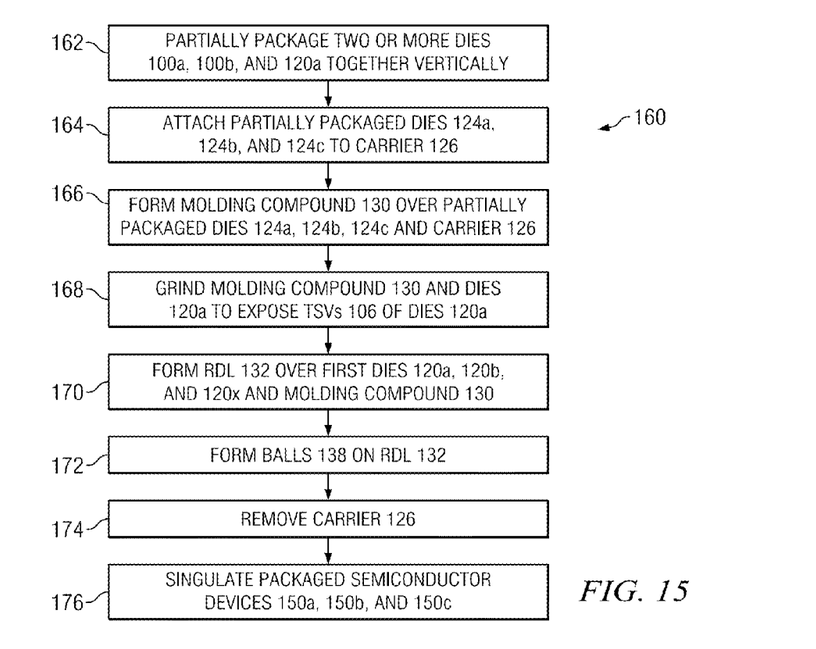
FIG. 15 is a flow chart illustrating a method of packaging semiconductor devices in accordance with embodiments.

FIG. 15 is a flow chart 160 of a method of packaging a plurality of dies 100a, 100b, and 120a in accordance with an embodiment of the present disclosure. First, two or more dies 100a or 100b and 120a are partially packaged together vertically (step 162), and the partially packaged devices 124a, 124b, and 124c are attached to a carrier 126 (step 164). A molding compound 130 is formed over the partially packaged devices 124a, 124b, 124c and the carrier 126 (step 166), the molding compound 130 and the bottom dies 120a (and also dies 120b and 120x) are ground in order to expose the TSVs 106 of the bottom dies 120a (and also dies 120b and 120x) (step 168). A wiring structure 132 comprising an RDL is formed over the first dies 120a, 120b, and 120x and the molding compound 130 (step 170), and conductive balls 138 are formed on the RDL 132 (step 172). The carrier 126 is removed (step 174), and the packaged semiconductor devices 150a, 150b, and 150c are singulated to separate them (step 176).

Embodiments of the present disclosure include methods of packaging semiconductor devices, integrated circuits, and dies. Methods of packaging two or more second dies 100a and 100b over a single first die 120a in a package are disclosed herein. Embodiments of the present disclosure also include methods of packaging a single first die 120a and a single second die 100a, for example.

Advantages of embodiments of the disclosure include providing novel methods of packaging multiple dies both vertically and horizontally in a single package. The novel methods are easily implementable in manufacturing process flows. By partially packaging dies before mounting them on a carrier 126, the ability to effectively recreate a wafer or workpiece is provided, by forming the molding compound 130 and the wiring structure 132. Using the carrier 126 and the partially packaged dies 124a, 124b, and 124c, the structure can be processed with additional processes as a bulk semiconductor wafer would be processed. The carrier 126 comprises a sacrificial component that is later removed, before singulating the packaged devices 150.

The novel packaging methods described herein advantageously do not require a substrate, which saves time, expense, space, and weight. The thickness of the packages is decreased because a substrate is not included. The packaging methods are highly reliable because there is no coefficient of thermal expansion (CTE) mismatch concern (because there is no substrate), and the packaging methods have low manufacturing costs and high yields. The dies 100a, 100b, 100c, 100d, . . . 100x may be attached and bonded to the first dies 120a, 120b, and 120x using bump-on-trace (BOT) techniques, which results in highly reduced costs.

Embodiments described herein employ chip redistribution and molding technology to effectively re-perform a new wafer using the carrier wafers 126, enlarging the chip area for RDL layout. 3D-SiP can be achieved by implementing TSV chip redistribution. Embodiments combine 3D-TSV and fan-out wafer level processing (WLP) to achieve a high input/output fan-out. Chip redistribution modeling methods are simplified, and a high amount of die shift control is achieved. The novel packaging methods described herein may advantageously be performed using wafer level processes in some embodiments.

SiP structures having a small form factor are achievable with embodiments described herein. More mature package types may be attached to the packages, such as free chip ball grid array (FCBGA), wire bond BGA, wafer level chip scale packages (WLCSP), or passive devices, as examples. 3D wafer level bonding (WLB) packages such as 3D eWLB packages and 3D-TSV eWLB packages, SiP, 3D-SiP, PoP structures, and fan-out WLPs are achievable by embodiments of the disclosure described herein.

The novel packaging techniques may be implemented in other WLP designs and packaging processes, other 3DIC package designs and packaging processes, other TSV package designs and packaging processes, bump-on-trace (BOT) packages and packaging processes, or chip-on-wafer assembly packages and packaging processes, as examples.

In accordance with one embodiment of the present disclosure, a packaging method for semiconductor devices includes providing a workpiece including a plurality of first dies, and coupling a plurality of second dies to the plurality of first dies. The plurality of second dies and the plurality of first dies are partially packaged and separated. Top surfaces of the second dies are coupled to a carrier, and the partially packaged plurality of second dies and plurality of first dies are fully packaged. The carrier is removed, and the fully packaged plurality of second dies and plurality of first dies are separated.

In accordance with another embodiment, a method of packaging semiconductor devices includes providing a workpiece including a plurality of first dies, the plurality of first dies having TSVs formed therein, and coupling a bottom surface of a plurality of second dies to each of the plurality of first dies. An underfill material is formed beneath the plurality of second dies, partially packaging the plurality of first dies and plurality of second dies, and the workpiece is singulated, separating the partially packaged plurality of first dies and plurality of second dies. The method includes fully packaging the plurality of first dies and plurality of second dies, and singulating the packaged plurality of first dies and plurality of second dies. Fully packaging the plurality of first dies and plurality of second dies comprises: coupling a top surface of the plurality of second dies to a carrier; forming a molding compound over the plurality of first dies the carrier; reducing a thickness of the plurality of first dies, exposing the TSVs of the plurality of first dies; forming a wiring structure over the TSVs of the plurality of first dies; forming a plurality of conductive bumps on the wiring structure; and removing the carrier.

In accordance with yet another embodiment, a method of packaging semiconductor devices includes providing a workpiece, the workpiece including a plurality of interposers formed thereon, the plurality of interposers including TSVs formed therein; and forming a plurality of microbumps on the plurality of interposers. The method includes coupling a bottom surface of a plurality of dies to the plurality of microbumps of each of the plurality of interposers, forming an underfill material beneath the plurality of dies, and singulating the workpiece, separating the plurality of interposers. A top surface of the plurality of dies is coupled to a carrier, and a molding compound is formed over the plurality of interposers and the carrier. A thickness of the molding compound and the plurality of interposers is reduced, exposing the TSVs of the plurality of interposers. An RDL is formed over the plurality of interposers, wherein portions of the RDL are electrically coupled to the TSVs of the plurality of interposers. The method includes forming a plurality of solder balls over portions of the RDL, removing the carrier, and singulating the packaged plurality of dies.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging method for semiconductor devices, the method comprising:
   providing a workpiece including a plurality of first dies;
   coupling a plurality of second dies to the plurality of first dies;
   partially packaging the plurality of second dies and the plurality of first dies;
   separating the partially packaged plurality of second dies and plurality of first dies;
   coupling top surfaces of the plurality of second dies to a carrier;

fully packaging the partially packaged plurality of second dies and plurality of first dies;

removing the carrier; and separating the fully packaged plurality of second dies and plurality of first dies.

2. The method according to claim 1, wherein fully packaging the partially packaged plurality of second dies and plurality of first dies comprises:

forming a molding compound over the plurality of first dies and the carrier;

reducing a thickness of the plurality of first dies and the molding compound, exposing conductive features formed within the plurality of first dies;

coupling a wiring structure to the exposed conductive features of the plurality of first dies; and forming a plurality of conductive bumps on the wiring structure.

3. The method according to claim 2, wherein coupling the wiring structure comprises forming a redistribution layer (RDL).

4. The method according to claim 2, wherein the conductive features formed within the plurality of first dies comprise through-substrate vias (TSVs).

5. The method according to claim 1, wherein partially packaging the plurality of second dies and the plurality of first dies comprises forming an underfill material beneath the plurality of second dies.

6. The method according to claim 1, wherein the plurality of first dies comprises a plurality of interposers.

7. The method according to claim 1, wherein the plurality of first dies comprises a plurality of functioning integrated circuits.

8. A method of packaging semiconductor devices, the method comprising:

providing a workpiece including a plurality of first dies, the plurality of first dies having through-substrate vias (TSVs) formed therein;

coupling a bottom surface of a plurality of second dies to each of the plurality of first dies;

forming an underfill material beneath the plurality of second dies, partially packaging the plurality of first dies and plurality of second dies;

singulating the workpiece, separating the partially packaged plurality of first dies and plurality of second dies;

fully packaging the partially packaged plurality of first dies and plurality of second dies; and singulating the packaged plurality of first dies and plurality of second dies, wherein fully packaging the plurality of first dies and plurality of second dies comprises: coupling a top surface of the plurality of second dies to a carrier; forming a molding compound over the plurality of first dies and the carrier; reducing a thickness of the plurality of first dies, exposing the TSVs of the plurality of first dies; forming a wiring structure over the TSVs of the plurality of first dies; forming a plurality of conductive bumps on the wiring structure; and removing the carrier.

9. The method according to claim 8, wherein reducing the thickness of the plurality of first dies comprises using a grinding process, an etch process, a polishing process, or a chemical-mechanical polishing (CMP) process.

10. The method according to claim 8, wherein the plurality of second dies comprise substantially a same size or function.

11. The method according to claim 8, wherein the plurality of second dies comprise a different size or function.

12. The method according to claim 8, wherein coupling the bottom surface of the plurality of second dies comprises coupling two or more of the plurality of second dies vertically over one of the plurality of first dies.

13. The method according to claim 12, wherein coupling the bottom surface of the plurality of second dies comprises coupling the two or more of the plurality of second dies horizontally with respect to one another.

14. The method according to claim 8, wherein forming the plurality of conductive bumps comprises forming controlled collapse chip connection (C4) bumps.

15. A method of packaging semiconductor devices, the method comprising:

providing a workpiece, the workpiece including a plurality of interposers formed thereon, the plurality of interposers including through-substrate vias (TSVs) formed therein;

forming a plurality of microbumps on the plurality of interposers;

coupling a bottom surface of a plurality of dies to the plurality of microbumps of each of the plurality of interposers;

forming an underfill material beneath the plurality of dies;

singulating the workpiece, separating the plurality of interposers;

coupling a top surface of the plurality of dies to a carrier;

forming a molding compound over the plurality of interposers and the carrier;

reducing a thickness of the molding compound and the plurality of interposers, exposing the TSVs of the plurality of interposers;

forming a redistribution layer (RDL) over the plurality of interposers, wherein portions of the RDL are electrically coupled to the TSVs of the plurality of interposers;

forming a plurality of solder balls over portions of the RDL;

removing the carrier; and singulating the packaged plurality of dies.

16. The method according to claim 15, wherein singulating the packaged plurality of dies comprises separating the plurality of dies in groups of two or more over the plurality of interposers.

17. The method according to claim 15, wherein the carrier comprises an adhesive on a top surface thereof, and wherein coupling the top surface of the plurality of dies to the carrier comprises coupling the top surface of the plurality of dies to the adhesive on the top surface of the carrier.

18. The method according to claim 15, wherein forming the plurality of solder balls comprises forming solder balls of a ball grid array (BGA).

19. The method according to claim 18, wherein an area of the BGA is larger than an area of one of the plurality of interposers.

20. The method according to claim 15, wherein the packaged plurality of dies comprises three dimensional integrated circuit (3DIC) fan-out wafer level packages (WLPs).

* * * * *